(12) United States Patent
Mitsuhashi et al.

(10) Patent No.: US 11,881,394 B2
(45) Date of Patent: Jan. 23, 2024

(54) STACK, ELECTRONIC DEVICE, AND METHOD FOR MANUFACTURING STACK

(71) Applicant: Sumitomo Electric Industries, Ltd., Osaka (JP)

(72) Inventors: Fuminori Mitsuhashi, Osaka (JP); Yasunori Tateno, Osaka (JP); Masahiro Adachi, Osaka (JP); Yoshiyuki Yamamoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 297 days.

(21) Appl. No.: 17/608,502

(22) PCT Filed: Mar. 26, 2020

(86) PCT No.: PCT/JP2020/013537
§ 371 (c)(1),
(2) Date: Nov. 3, 2021

(87) PCT Pub. No.: WO2021/005847
PCT Pub. Date: Jan. 14, 2021

(65) Prior Publication Data
US 2022/0231123 A1    Jul. 21, 2022

(30) Foreign Application Priority Data

Jul. 5, 2019 (JP) .................... 2019-125868

(51) Int. Cl.
*H01L 21/00*   (2006.01)
*H01L 29/06*   (2006.01)
(Continued)

(52) U.S. Cl.
CPC ........ *H01L 29/0657* (2013.01); *H01L 21/223* (2013.01); *H01L 29/1037* (2013.01);
(Continued)

(58) Field of Classification Search
CPC ............... H01L 29/0657; H01L 21/223; H01L 29/1037; H01L 29/1606; H01L 29/1608;
(Continued)

(56) References Cited

U.S. PATENT DOCUMENTS 10,774,444 B2 *  9/2020  Muto ................ H01L 21/02529
11,264,465 B2 *  3/2022  Linthicum .......... H01L 29/2003
(Continued)

FOREIGN PATENT DOCUMENTS

JP    2013-180930 A    9/2013
JP    2018-35051 A     3/2018
(Continued)

OTHER PUBLICATIONS

Sekine et al., "Growth of Graphene on a Single SiC Terrace", Extended Abstracts. JSAP Spring Meeting, Mar. 5, 2018, 1 page.
(Continued)

*Primary Examiner* — Richard A Booth
(74) *Attorney, Agent, or Firm* — XSENSUS LLP

(57) ABSTRACT

A stack includes a base portion consisting of silicon carbide and having a first surface that is a Si face and a carbon atom thin film disposed on the first surface and including a first main surface facing the first surface and a second main surface that is a main surface on an opposite side from the first main surface. The carbon atom thin film consists of carbon atoms. The carbon atom thin film includes at least one of a buffer layer that is a carbon atom layer including carbon atoms bonded to silicon atoms forming the Si face and a graphene layer. The second main surface includes a plurality of terraces parallel to the Si face of the silicon carbide forming the base portion and a plurality of steps connecting together the plurality of terraces.

20 Claims, 9 Drawing Sheets

(51) Int. Cl.
*H01L 21/223* (2006.01)
*H01L 29/10* (2006.01)
*H01L 29/16* (2006.01)
*H01L 29/165* (2006.01)
*H01L 29/66* (2006.01)

(52) U.S. Cl.
CPC ........ *H01L 29/165* (2013.01); *H01L 29/1606* (2013.01); *H01L 29/1608* (2013.01); *H01L 29/66045* (2013.01); *H01L 29/66068* (2013.01)

(58) Field of Classification Search
CPC ............. H01L 29/165; H01L 29/66045; H01L 29/66068
See application file for complete search history.

(56) References Cited

U.S. PATENT DOCUMENTS

| | | |
|---|---|---|
| 2011/0143093 A1 | 6/2011 | Kusunoki et al. |
| 2018/0069081 A1 | 3/2018 | Nagasawa et al. |
| 2019/0136411 A1 | 5/2019 | Kaneko et al. |

FOREIGN PATENT DOCUMENTS

| | | |
|---|---|---|
| WO | 2010/023934 A1 | 3/2010 |
| WO | 2013/125669 A1 | 8/2013 |
| WO | 2017/188382 A1 | 11/2017 |

OTHER PUBLICATIONS

International Search Report and Written Opinion dated Jun. 23, 2020, received for PCT Application PCT/JP2020/013537, filed on Mar. 26, 2020, 10 pages with English translation.

Bao et al., "Sequential Control of Step-Bunching during Graphene Growth on SiC(0001)", Applied Physics Letters 109, 081602, 2016, pp. 081602-1-081602-5.

* cited by examiner

STACK, ELECTRONIC DEVICE, AND METHOD FOR MANUFACTURING STACK

CROSS-REFERENCE TO RELATED APPLICATIONS

The present application is based on PCT filing PCT/JP2020/013537, filed Mar. 26, 2020, which claims priority to Japanese Patent Application No. 2019-125868, filed on Jul. 5, 2019, the entire contents of each are incorporated herein by reference.

TECHNICAL FIELD

The present disclosure relates to stacks, electronic devices, and methods for manufacturing stacks.

BACKGROUND ART

Graphene is a material in which carbon atoms are bonded together in a plane by forming $sp^2$ hybrid orbitals. Due to such a bonding state of carbon atoms, graphene exhibits very high carrier (electron) mobility. If graphene can be effectively utilized as channels of electronic devices such as transistors, the performance of electronic devices can be improved.

A method has been proposed in which a substrate consisting of silicon carbide (SiC) is heated to remove silicon atoms and thereby convert the surface layer portion of the substrate into graphene (see, for example, NPL 1). NPL 1 discloses graphene, having a step-terrace structure, that is manufactured by performing hydrogen treatment before removing silicon atoms to produce graphene, and adjusting the heating rate.

CITATION LIST

Non Patent Literature

NPL 1: Jianfeng Bao et al., "Sequential control of step-bunching during graphene growth on SiC(0001)", APPLIED PHYSICS LETTERS 109, 081602 (2016)

SUMMARY OF INVENTION

A stack according to the present disclosure includes a base portion consisting of silicon carbide and having a first surface that is a Si face and a carbon atom thin film disposed on the first surface and including a first main surface facing the first surface and a second main surface that is a main surface on an opposite side from the first main surface. The carbon atom thin film consists of carbon atoms. The carbon atom thin film includes at least one of a buffer layer that is a carbon atom layer including carbon atoms bonded to silicon atoms forming the Si face and a graphene layer. The second main surface includes a plurality of terraces parallel to the Si face of the silicon carbide forming the base portion and a plurality of steps connecting together the plurality of terraces. The terraces have a width of 5 μm or more and 500 μm or less. The steps have a height of 10 nm or more and 500 nm or less.

DESCRIPTION OF EMBODIMENTS

Figure 1:
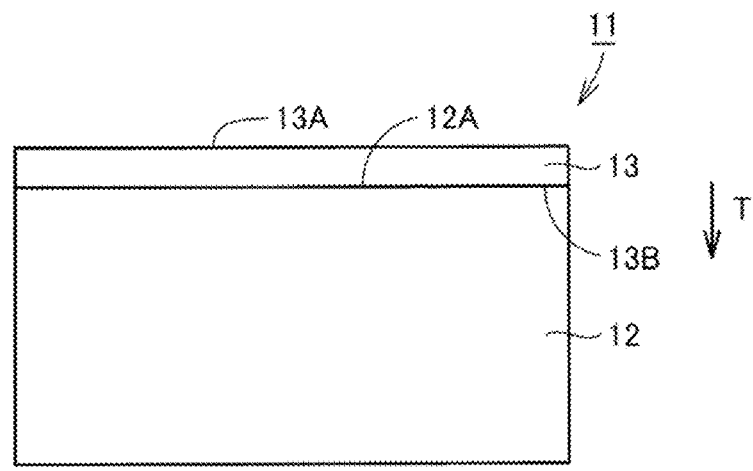
FIG. 1 is a schematic sectional view illustrating the structure of a stack according to a first embodiment.

Problems to be Solved by Present Disclosure

An electronic device manufactured using the graphene disclosed in NPL 1 has a problem in that good modulation characteristics cannot be achieved. Accordingly, one object is to provide a stack that allows the modulation characteristics of an electronic device to be improved, an electronic device including the stack, and a method for manufacturing the stack.

Advantageous Effects of Present Disclosure

The above stack allows the modulation characteristics of an electronic device to be improved.

Description of Embodiments of Present Disclosure

First, embodiments of the present disclosure will be listed and described. A stack according to the present disclosure includes a base portion consisting of silicon carbide and having a first surface that is a Si face and a carbon atom thin film disposed on the first surface and including a first main surface facing the first surface and a second main surface that is a main surface on an opposite side from the first main surface. The carbon atom thin film consists of carbon atoms. The carbon atom thin film includes at least one of a buffer layer that is a carbon atom layer including carbon atoms bonded to silicon atoms forming the Si face and a graphene layer. The second main surface includes a plurality of terraces parallel to the Si face of the silicon carbide forming the base portion and a plurality of steps connecting together the plurality of terraces. The terraces have a width of 5 µm or more and 500 µm or less. The steps have a height of 10 nm or more and 500 nm or less.

For example, when a carbon atom thin film is used as a channel layer of a transistor, the transistor may be manufactured by forming electrodes on a region including terraces that are included in the second main surface and that allow for stable charge transport. However, if the terraces have a small width, a large number of steps are included in the channel layer. In the carbon atom thin film, regions including steps and regions including terraces have different electrical characteristics. If a large number of steps are included in the channel layer of the transistor, it is difficult to achieve good modulation characteristics. For example, a terrace width of at least 5 µm is required to form a channel layer including no steps.

For the stack according to the present disclosure, the terraces have a width of 5 µm or more and 500 µm or less. Because the terraces have a width of 5 µm or more, a channel layer of a transistor can be easily formed in a region including a single terrace. In addition, because the terraces have a large width, a channel layer of a transistor can be formed with a reduced number of steps included in the channel layer. Thus, good modulation characteristics can be easily imparted to the manufactured transistor. On the other hand, if the terraces have an excessive width, the steps consequently have an excessive height, and the carbon atom thin film is likely to be broken in regions where the steps are located. Because the terraces have a width of 500 µm or less, the likelihood of the carbon atom thin film being broken can be reduced. In the present disclosure, "terrace" refers to a region where the in-plane step difference is within the range of ±1 nm.

In addition, the steps have a height of 10 nm or more and 500 nm or less. When the carbon atom thin film includes a buffer layer, the buffer layer is preferably converted into a graphene layer by breaking the bonds between the silicon atoms forming the Si face and the carbon atoms included in the buffer layer. In this case, the bonds between the silicon atoms and the carbon atoms may be broken, for example, by supplying hydrogen gas to the stack, specifically, between the Si face and the carbon atom thin film. In this way, the buffer layer is converted into a graphene layer. The terraces have low gas permeability; therefore, it is difficult to supply hydrogen gas between the Si face and the carbon atom thin film through the terraces.

For the stack according to the present disclosure, the steps have a height of 10 nm or more; therefore, hydrogen gas easily passes through regions including the steps in the direction along the terraces. Thus, hydrogen gas can be easily supplied between the Si face and the carbon atom thin film. Accordingly, hydrogen gas treatment for breaking the bonds between the silicon atoms and the carbon atoms can be efficiently performed. On the other hand, if the steps have a height of more than 500 nm, the carbon atom thin film is likely to be broken in the regions including the steps. Because the steps have a height of 500 nm or less, the likelihood of the carbon atom thin film being broken can be reduced. As described above, because the terraces of the stack according to the present disclosure has a large width, and the buffer layer can be easily converted into a graphene layer by breaking the bonds between the silicon atoms and the carbon atoms, the modulation characteristics of an electronic device can be improved.

In the above stack, the number of atomic layers of the graphene layer may be three or less. In this case, a stack including a graphene layer that can stably ensure high carrier mobility can be obtained.

An electronic device according to the present disclosure includes the above stack, a first electrode disposed on the second main surface, and a second electrode disposed away from the first electrode on the second main surface. Because the electronic device according to the present disclosure includes the above stack, the modulation characteristics can be improved.

A method for manufacturing a stack according to the present disclosure includes the steps of providing a silicon carbide substrate having a first substrate surface that is a Si face; placing the silicon carbide substrate in a first space enclosed by a cover member disposed in a chamber; and heating the silicon carbide substrate in the first space to remove silicon atoms from a first region including the first substrate surface, thereby converting the first region into at least one of a buffer layer that is a carbon atom layer including carbon atoms bonded to silicon atoms forming the silicon carbide substrate and a graphene layer. A first member including a material containing silicon atoms is disposed in the first space.

Thus, silicon atoms can be supplied from the first member to the first space enclosed by the cover member to increase the concentration of silicon atoms in the first space. When silicon atoms are removed from the first region including the first substrate surface, the surface diffusion of carbon atoms and silicon atoms in the first region can be promoted. Therefore, when the first region is converted into at least one of a buffer layer and a graphene layer, the terrace width of the first surface can be easily increased, and the step height of the first surface can be easily increased. Thus, a stack having a large terrace width and a large step height can be easily obtained.

In the above method for manufacturing a stack, the first member may be a silicon layer covering at least a portion of an inner wall of the cover member. In this case, silicon atoms can be easily supplied to the first space.

Details of Embodiments of Present Disclosure

Next, an embodiment of a stack of the present disclosure will be described with reference to the drawings. In the following drawings, the same or corresponding parts are denoted by the same reference numerals, and a description thereof is not repeated.

First Embodiment

Figure 2:
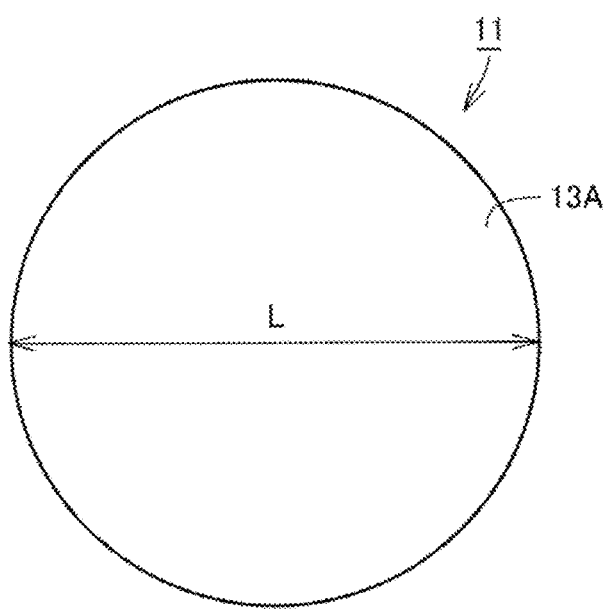
FIG. 2 is a plan view of the stack illustrated in FIG. 1 as viewed in the thickness direction.

A stack according to a first embodiment of the present disclosure will be described. FIG. 1 is a schematic sectional view illustrating the structure of the stack according to the first embodiment. FIG. 2 is a view of the stack illustrated in FIG. 1 as viewed in the thickness direction. In FIG. 1, the thickness direction of a stack 11 is indicated by the arrow T.

Referring to FIGS. 1 and 2, the stack 11 according to the first embodiment is disc-shaped. As the diameter L of the stack 11 illustrated in FIG. 2, for example, 2 inches (50.8 mm) is selected. As the diameter L of the stack 11, for example, 4 inches (101.6 mm) may also be selected.

The stack 11 according to the first embodiment includes a base portion 12 and a carbon atom thin film 13. The base portion 12 is plate-shaped. The base portion 12 consists of silicon carbide (SiC). The SiC forming the base portion 12 is hexagonal SiC having, for example, a 6H structure. The SiC forming the base portion 12 may also be hexagonal SiC having a 4H structure. The base portion 12 has a first surface 12A. The first surface 12A is a Si face of the SiC forming the base portion 12. In FIG. 1, the carbon atom thin film 13 is illustrated as being thick for ease of understanding. The thickness direction of the carbon atom thin film 13 is indicated by the arrow T.

The carbon atom thin film 13 consists of carbon atoms. The carbon atom thin film 13 is disposed on the first surface 12A of the base portion 12. The carbon atom thin film 13 includes a first main surface 13B facing the first surface 12A and a second main surface 13A that is a main surface on the opposite side from the first main surface 13B. The second main surface 13A is an exposed surface. The carbon atom thin film 13 includes at least one of a buffer layer that is a carbon atom layer including carbon atoms bonded to silicon atoms forming the first surface 12A, which is a Si face, and a graphene layer.

Figure 3:
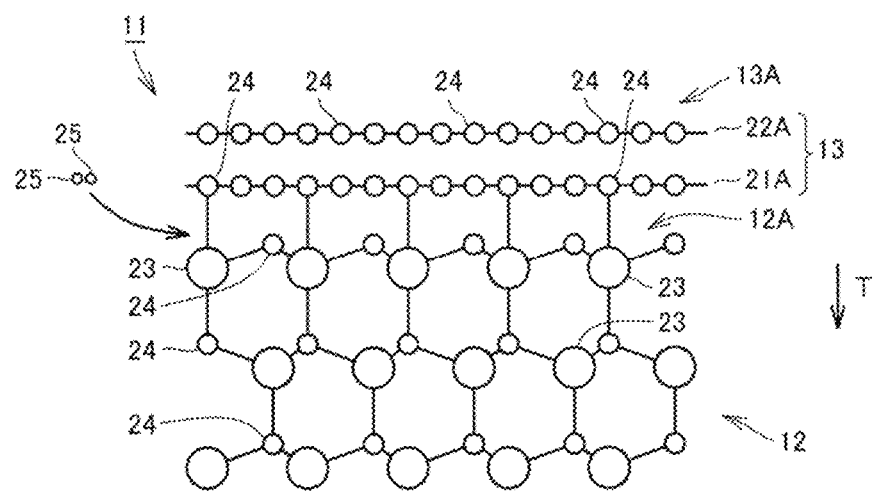
FIG. 3 is a conceptual diagram illustrating an example of the bonding state of atoms forming the stack illustrated in FIG. 1.

FIG. 3 is a conceptual diagram illustrating an example of the bonding state of atoms forming the stack 11 illustrated in FIG. 1. Referring to FIG. 3, the carbon atom thin film 13 includes a buffer layer 21A and a graphene layer 22A. The buffer layer 21A is a carbon atom layer including carbon atoms 24 bonded to silicon atoms 23 forming the first surface 12A of the base portion 12. In this embodiment, the buffer layer 21A is disposed between the graphene layer 22A and the first surface 12A in the thickness direction. The graphene layer 22A is disposed at the second main surface 13A. For the stack 11 illustrated in FIG. 3, the number of atomic layers of the graphene layer 22A is one.

Figure 4:
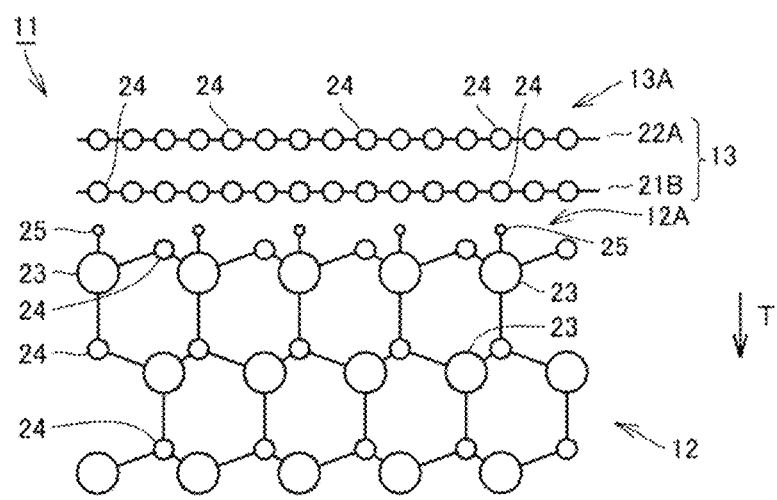
FIG. 4 is a conceptual diagram illustrating the bonding state of the atoms after the conversion of a buffer layer into a graphene layer.

For the stack 11 illustrated in FIG. 3, the buffer layer 21A can be converted into a graphene layer, for example, by hydrogen intercalation. FIG. 4 is a conceptual diagram illustrating the bonding state of the atoms after the conversion of the buffer layer 21A into a graphene layer. Referring to FIGS. 3 and 4, when hydrogen atoms 25 are supplied between the first surface 12A and the buffer layer 21A, with the stack 11 being heated to a predetermined temperature, the bonds between the silicon atoms 23 and the carbon atoms 24 included in the buffer layer 21A are broken, and the silicon atoms 23 bond to the hydrogen atoms 25 (see FIG. 4). The buffer layer 21A, which is a carbon atom layer including carbon atoms 24 having their bonds with the silicon atoms 23 broken, becomes a graphene layer 21B. In the state illustrated in FIG. 4, the number of atomic layers of the graphene layers 22A and 21B is two. The number of atomic layers of the graphene layers 22A and 21B can be determined, for example, by observing a micrograph captured with magnification under an atomic force microscope (AFM).

Figure 5:
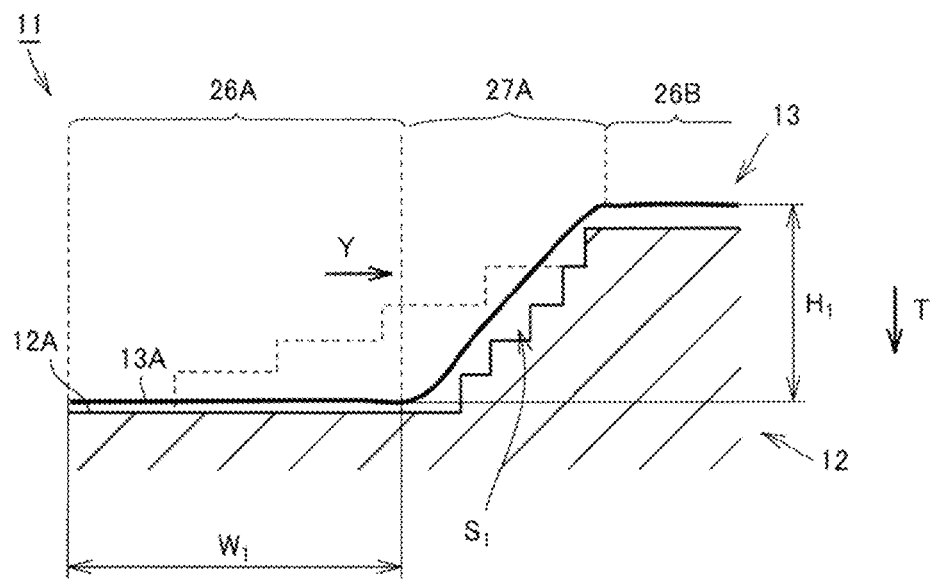
FIG. 5 is a schematic sectional view schematically illustrating, in an enlarged view, a portion of the stack including a second main surface.
Figure 6:
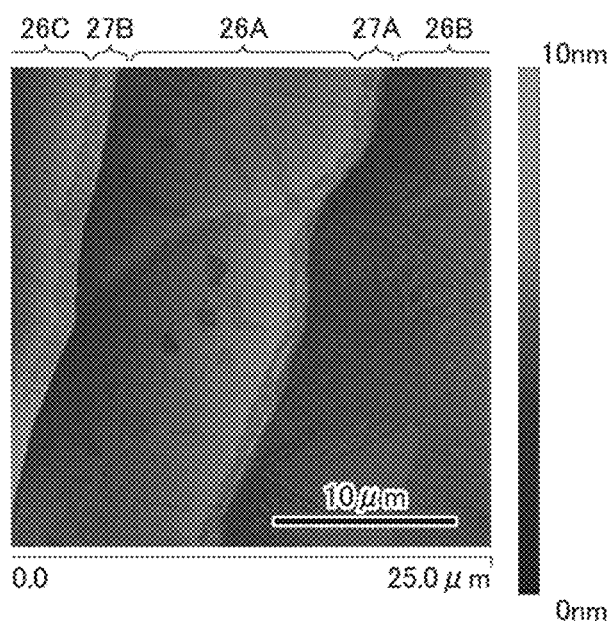
FIG. 6 is a micrograph, captured with magnification under an AFM, of a portion of the second main surface of the stack illustrated in FIG. 1.

The second main surface 13A of the carbon atom thin film 13 includes a plurality of terraces and a plurality of steps. FIG. 5 is a schematic sectional view schematically illustrating, in an enlarged view, a portion of the stack 11 including the second main surface 13A illustrated in FIG. 1. FIG. 6 is a micrograph, captured with magnification under an AFM, of a portion of the second main surface 13A of the stack 11 illustrated in FIG. 1. FIG. 6 is a view as viewed in the thickness direction of the carbon atom thin film 13.

Referring to FIGS. 5 and 6, the second main surface 13A of the carbon atom thin film 13 includes a plurality of terraces, specifically, a first terrace 26A, a second terrace 26B, and a third terrace 26C, and a plurality of steps, specifically, a first step 27A and a second step 27B. The first terrace 26A, the second terrace 26B, and the third terrace 26C are each parallel to the Si face of the silicon carbide forming the base portion 12, i.e., the first surface 12A. The first step 27A connects the first terrace 26A to the second terrace 26B. The second step 27B connects the first terrace 26A to the third terrace 26C. A step-terrace structure is formed on the second main surface 13A of the carbon atom thin film 13.

The first terrace 26A has a width $W_1$ of 5 µm or more and 500 µm or less. Specifically, the first terrace 26A has a width $W_1$ of more than 10 µm. Similarly, the other terraces, namely, the second terrace 26B and the third terrace 26C, have a width of 5 µm or more and 500 µm or less. The first step 27A has a height $H_1$ of 10 nm or more and 500 nm or less. Similarly, the other step, namely, the second step 27B, has a height of 10 nm or more and 500 nm or less.

According to this embodiment, the first terrace 26A has a width $W_1$ of 5 µm or more and 500 µm or less. Because the first terrace 26A has a width $W_1$ of 5 µm or more, a channel layer of a transistor can be easily formed in a region including the single first terrace 26A. In addition, because the first terrace 26A has a large width $W_1$, a channel layer of a transistor can be formed with a reduced number of steps included in the channel layer. Thus, good modulation characteristics can be easily imparted to the manufactured transistor. On the other hand, if the first terrace 26A has an excessive width $W_1$, the first step 27A consequently has an excessive height $H_1$, and the carbon atom thin film 13 is likely to be broken in a region where the first step 27A is located. Because the first terrace 26A has a width $W_1$ of 500 µm or less, the likelihood of the carbon atom thin film 13 being broken can be reduced. To reduce the fabrication time and facilitate fabrication, the first terrace 26A preferably has a width $W_1$ of 5 µm or more and 200 µm or less. To further reduce the fabrication time and facilitate fabrication, the first terrace 26A preferably has a width $W_1$ of 5 µm or more and 100 µm or less.

Because the first step 27A has a height $H_1$ of 10 nm or more, hydrogen gas easily passes through a region including the first step 27A in the direction along the first terrace 26A. Thus, hydrogen gas can be easily supplied to an interface Si between the Si face and the carbon atom thin film 13. Accordingly, hydrogen gas treatment for breaking the bonds between the silicon atoms and the carbon atoms can be efficiently performed. On the other hand, if the first step 27A has a height $H_1$ of more than 500 nm, the carbon atom thin film 13 is likely to be broken in the region including the first step 27A. Because the first step 27A has a height $H_1$ of 500 nm or less, the likelihood of the carbon atom thin film 13 being broken can be reduced. To reduce the fabrication time and facilitate fabrication, the first step 27A preferably has a height $H_1$ of 10 nm or more and 200 nm or less. To further reduce the fabrication time and facilitate fabrication, the first step 27A preferably has a height $H_1$ of 10 nm or more and 100 nm or less.

As described above, because the first terrace 26A of the stack 11 according to this embodiment has a large width $W_1$, and the buffer layer 21A can be easily converted into the graphene layer 21B by breaking the bonds between the silicon atoms and the carbon atoms, the modulation characteristics of a transistor serving as an electronic device can be improved.

Figure 7:
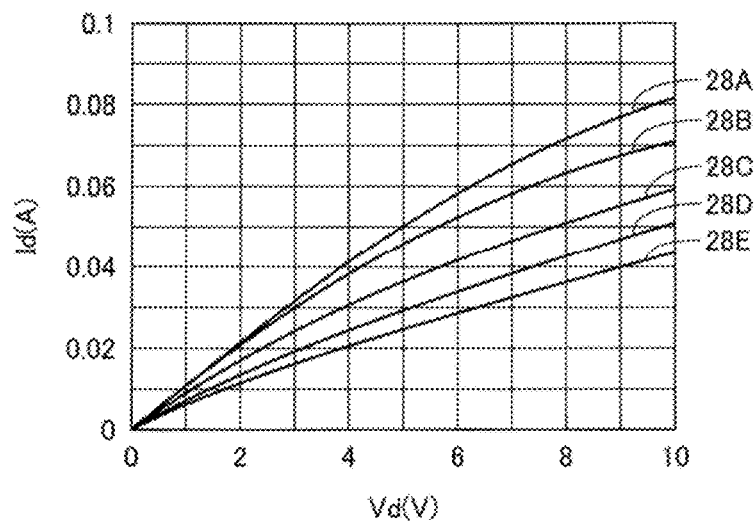
FIG. 7 is a graph illustrating the relationship between drain voltage and drain current with varying gate voltages for a transistor manufactured using the stack according to the first embodiment.

FIG. 7 is a graph illustrating the relationship between drain voltage and drain current with varying gate voltages for a transistor manufactured using the stack 11 according to the first embodiment. In FIG. 7, the vertical axis includes the drain current (A), and the horizontal axis indicates the drain voltage (V). In FIG. 7, a line 28A indicates a case where the gate voltage is 10 V; a line 28B indicates a case where the gate voltage is 5 V; a line 28C indicates a case where the gate voltage is 0 V; a line 28D indicates a case where the gate voltage is −5 V; and a line 28E indicates a case where the gate voltage is −10 V.

Referring to FIG. 7, the drain current that flows depending on the magnitude of the applied drain voltage changes as the gate voltage is varied from −10 V to 10 V in steps of 5 V. That is, the modulation characteristics are improved.

In the above embodiment, the number of atomic layers of the graphene layers 22A and 21B may be three or less. In this case, a stack 11 including a graphene layer that can stably ensure high carrier mobility can be obtained.

Figure 8:
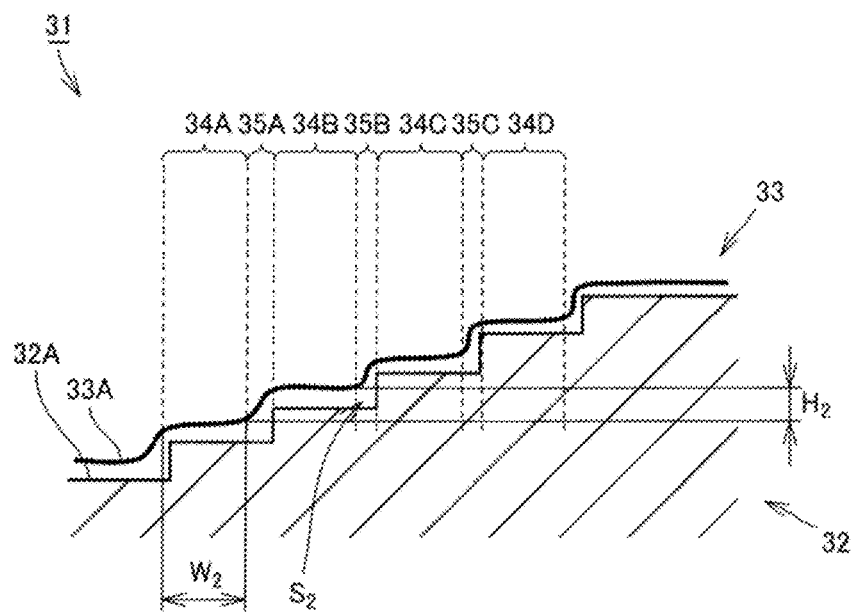
FIG. 8 is a schematic sectional view schematically illustrating, in an enlarged view, a second main surface of a stack outside the scope of the present disclosure.

FIG. 8 is a schematic sectional view schematically illustrating, in an enlarged view, a portion of a stack outside the scope of the present disclosure. Referring to FIG. 8, a second main surface 33A of a carbon atom thin film 33 included in a stack 31 includes a plurality of terraces, specifically, a first terrace 34A, a second terrace 34B, a third terrace 34C, and a fourth terrace 34D, and a plurality of steps, specifically, a first step 35A, a second step 35B, and a third step 35C. The first terrace 34A, the second terrace 34B, the third terrace 34C, and the fourth terrace 34D are each parallel to a Si face of silicon carbide forming a base portion 32, i.e., a first surface 32A. The first step 35A connects the first terrace 34A to the second terrace 34B. The second step 35B connects the second terrace 34B to the third terrace 34C. The third step 35C connects the third terrace 34C to the fourth terrace 34D. A step-terrace structure is formed on the second main surface 33A of the carbon atom thin film 33.

The first terrace 34A has a width $W_2$ of about 2 µm, which is smaller than the width $W_1$ of the first terrace 26A of the stack 11 according to the first embodiment described above. The other terraces also have a similar width, that is, a width smaller than the width $W_1$ of the first terrace 26A. The first step 35A has a height $H_2$ smaller than the height $H_1$ of the first step 27A of the stack 11 according to the first embodiment described above. The other steps also have a similar height, that is, a height smaller than the height $H_1$ of the first step 27A.

If such a stack 31 is used to manufacture a transistor, a large number of steps are included in the channel layer because the first terrace 34A, the second terrace 34B, the third terrace 34C, and the fourth terrace 34D are narrow. Thus, a transistor manufactured using such a stack 31 has poor modulation characteristics. In addition, because there is only a small interface $S_2$ between the Si face and the carbon atom thin film 33, hydrogen gas is not easily supplied between the Si face and the carbon atom thin film 33, and the buffer layer included in the carbon atom thin film 33 is not easily converted into a graphene layer.

Figure 9:
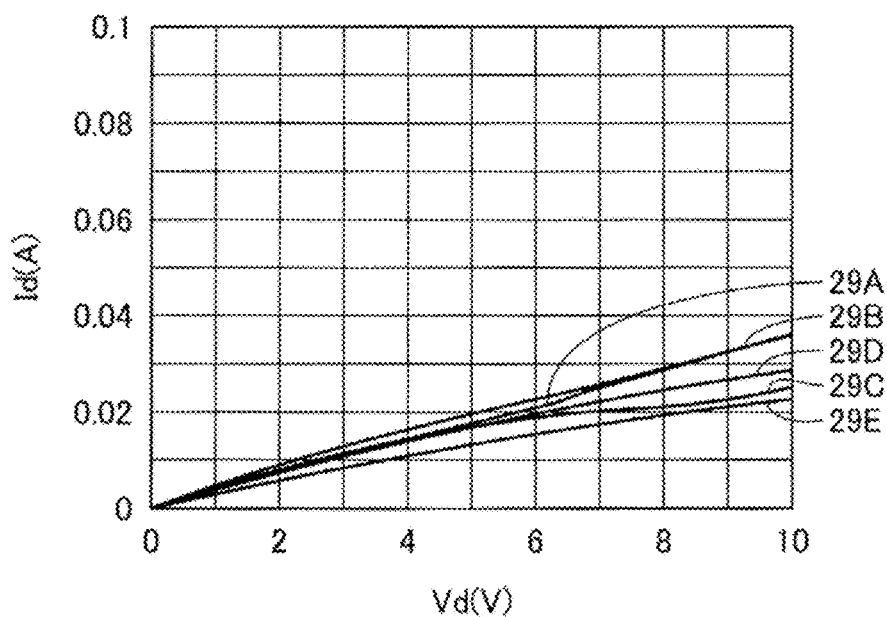
FIG. 9 is a graph illustrating the relationship between drain voltage and drain current with varying gate voltages for a transistor manufactured using the stack illustrated in FIG. 8.

FIG. 9 is a graph illustrating the relationship between drain voltage and drain current with varying gate voltages for a transistor manufactured using the stack 31 illustrated in FIG. 8. In FIG. 9, the vertical axis and the horizontal axis are the same as those in FIG. 7. In FIG. 9, a line 29A indicates a case where the gate voltage is 10 V; a line 29B indicates a case where the gate voltage is 5 V; a line 29C indicates a case where the gate voltage is 0 V; a line 29D indicates a case where the gate voltage is −5 V; and a line 29E indicates a case where the gate voltage is −10 V.

Referring to FIG. 9, the line 29A, the line 29B, the line 29C, the line 29D, and the line 29E almost overlap. That is, the drain current that flows depending on the magnitude of the applied drain voltage remains almost unchanged as the gate voltage is varied from −10 V to 10 V in steps of 5 V. An electronic device including such a stack 31 does not have good modulation characteristics.

Figure 11:
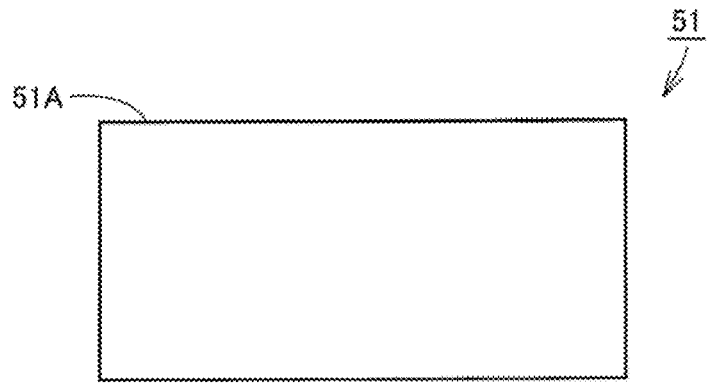
FIG. 11 is a schematic sectional view for illustrating the method for manufacturing the stack according to the first embodiment.
Figure 12:
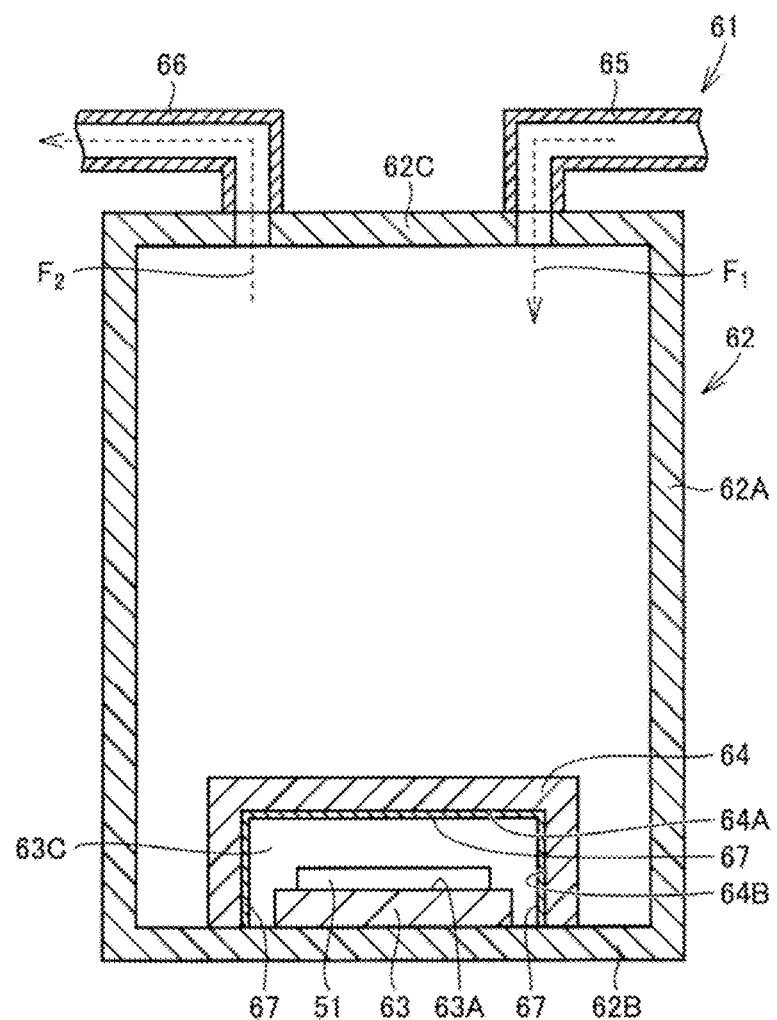
FIG. 12 is a schematic sectional view illustrating the structure of a heating device.

Next, an outline of an example method for manufacturing the stack 11 according to the first embodiment will be described with reference to FIGS. 10 to 12.

Figure 10:
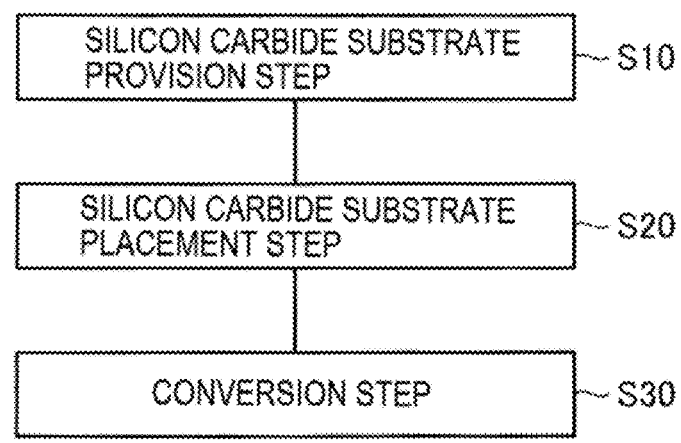
FIG. 10 is a flowchart illustrating typical steps of a method for manufacturing the stack according to the first embodiment.

FIG. 10 is a flowchart illustrating typical steps of the method for manufacturing the stack 11 according to the first embodiment. Referring to FIG. 10, in the method for manufacturing the stack 11 according to the first embodiment, a raw material substrate provision step is first performed as step (S10). FIG. 11 is a schematic sectional view for illustrating the method for manufacturing the stack 11. Referring to FIG. 11, in this step (S10), for example, a silicon carbide substrate 51 consisting of 6H—SiC and having a diameter of 2 inches (50.8 mm) is provided. Specifically, for example, the silicon carbide substrate 51 consisting of SiC is obtained by slicing an ingot consisting of SiC. The surface of the silicon carbide substrate 51 is polished and is then subjected to a process such as cleaning to ensure that the main surface has sufficient flatness and cleanliness. The silicon carbide substrate 51 has a first substrate surface 51A. The first substrate surface 51A is a Si face of the SiC forming the silicon carbide substrate 51.

Next, a silicon carbide substrate placement step is performed as a step (S20) of placing the silicon carbide substrate in a first space enclosed by a cover member disposed in a chamber. This step (S20) can be performed, for example, using a heating device illustrated in FIG. 12. FIG. 12 is a schematic sectional view illustrating the structure of the heating device. Referring to FIG. 12, a heating device 61 includes a chamber 62, a susceptor 63, a cover member 64, a gas introduction pipe 65, and an exhaust pipe 66.

The chamber 62 includes a side wall portion 62A having a hollow cylindrical shape, a bottom wall portion 62B closing off a first end of the side wall portion 62A, and an upper wall portion 62C closing off a second end of the side wall portion 62A. The susceptor 63 is disposed on the bottom wall portion 62B inside the chamber 62. The susceptor 63 has a substrate holding surface 63A for holding the silicon carbide substrate 51.

The cover member 64 for covering the susceptor 63 is disposed inside the chamber 62. For example, the cover member 64 has a hollow cylindrical shape having one of its pair of ends closed off and the other end open. The cover member 64 is disposed such that the other end of the cover member 64 is in contact with the bottom wall portion 62B. The susceptor 63 and the silicon carbide substrate 51 on the susceptor 63 are surrounded by the cover member 64 and the bottom wall portion 62B of the chamber 62. The susceptor 63 and the silicon carbide substrate 51 on the susceptor 63 are disposed in a first space 63C that is a space surrounded by the cover member 64 and the bottom wall portion 62B of the chamber 62. The upper wall surface 64A of the cover member 64 faces the first substrate surface 51A of the silicon carbide substrate 51.

Here, as a technique for obtaining the stack 11 according to the first embodiment described above, for example, silicon atoms are removed from the Si face by heating, with silicon disposed in the first space 63C surrounded by the cover member 64. As one specific example, silicon is deposited on the upper wall surface 64A, facing the first substrate surface 51A, and the side wall surface 64B, facing the susceptor 63, of the cover member 64. That is, a silicon layer 67 serving as a first member including a material containing silicon atoms is disposed in the first space 63C. More specifically, the silicon layer 67 is deposited on the upper wall surface 64A and the side wall surface 64B by vapor deposition. This reduces the speed at which silicon atoms are removed from the first substrate surface 51A and thus allows the steps to recede by migration while leaving some of the ends of the steps, so that the stack 11 according to the first embodiment can be easily obtained. The positions at which the steps are located before receding and the direction in which the steps recede are indicated by the dashed line and the arrow Y FIG. 5.

The gas introduction pipe 65 and the exhaust pipe 66 are connected to the upper wall portion 62C of the chamber 62. The gas introduction pipe 65 and the exhaust pipe 66 are each connected at one end to a through-hole formed in the upper wall portion 62C. The other end of the gas introduction pipe 65 is connected to a gas reservoir (not illustrated) that holds an inert gas. In the first embodiment, argon is held in the gas reservoir. The other end of the exhaust pipe 66 is connected to an exhaust device (not illustrated) such as a pump.

Step (S20) can be performed using the heating device 61 as follows. The silicon carbide substrate 51 provided in step (S10) is first placed on the substrate holding surface 63A of the susceptor 63. Next, the cover member 64 is placed on the bottom wall portion 62B so as to cover the susceptor 63 and the silicon carbide substrate 51 in step (S20). Thus, the susceptor 63 and the silicon carbide substrate 51 on the susceptor 63 are surrounded by the cover member 64 and the bottom wall portion 62B of the chamber 62 and are placed in the first space 63C.

Next, while a valve (not illustrated) attached to the gas introduction pipe 65 is closed, a valve (not illustrated) attached to the exhaust pipe 66 is opened. The exhaust device connected to the exhaust pipe 66 is then operated to discharge gas inside the chamber 62 from the exhaust pipe 66 along the arrow $F_2$. Thus, the pressure inside the chamber 62 is reduced. Here, although the susceptor 63 and the silicon carbide substrate 51 are surrounded by the cover member 64 and the bottom wall portion 62B of the chamber 62, the cover member 64 and the bottom wall portion 62B are not joined together. Therefore, as the pressure inside the chamber 62 is reduced, gas inside the first space 63C is discharged from a slight gap between the cover member 64 and the bottom wall portion 62B due to the pressure difference between the inside and outside of the first space 63C. As a result, the pressure in the first space 63C is also reduced.

Next, the operation of the exhaust device is stopped, and the valve attached to the gas introduction pipe 65 is opened. Thus, argon held in the gas reservoir flows through the gas introduction pipe 65 and is introduced into the chamber 62 along the arrow $F_1$. Here, as the pressure in the chamber 62 increases, argon enters the first space 63C through the slight gap between the cover member 64 and the bottom wall portion 62B due to the pressure difference between the inside and outside of the first space 63C. In this way, the gas inside the chamber 62 is replaced by argon. When the argon pressure inside the chamber 62 increases to normal pressure (atmospheric pressure), excess argon is discharged from the exhaust pipe 66, thus maintaining the inside pressure at normal pressure. That is, an argon atmosphere at normal pressure is maintained inside the chamber 62.

Next, a conversion step is performed as a step (S30) of heating the silicon carbide substrate in the first space to remove silicon atoms from a first region including the first substrate surface, thereby converting the first region into at least one of a buffer layer that is a carbon atom layer including carbon atoms bonded to silicon atoms forming the silicon carbide substrate and a graphene layer. In this step, the silicon carbide substrate 51 is heated. For example, the silicon carbide substrate 51 is heated by heating the chamber 62. The chamber 62 may be heated, for example, by induction heating. For example, the silicon carbide substrate 51 is heated to a temperature of 1,300° C. or higher and 1,800° C. or lower in argon at normal pressure. As specific conditions for heating treatment, for example, the silicon carbide substrate 51 may be heated at 1,800° C. for 10 minutes. Thus, referring to FIG. 11, silicon atoms are removed from the first substrate surface 51A side of the silicon carbide substrate 51 consisting of SiC, thereby converting the surface layer portion including the first substrate surface 51A into a carbon atom thin film.

In this way, referring to FIG. 1, the stack 11 including the base portion 12 consisting of SiC and the carbon atom thin film 13 disposed on the first surface 12A of the base portion 12 is obtained.

Thus, silicon atoms can be supplied from the silicon layer 67 serving as the first member to the first space 63C enclosed by the cover member 64 to increase the concentration of silicon atoms in the first space 63C. When silicon atoms are removed from the first region including the first substrate surface 51A, the surface diffusion of carbon atoms and silicon atoms in the first region can be promoted. Therefore, when the first region is converted into at least one of a buffer layer and a graphene layer, the terrace width of the first surface can be easily increased, and the step height of the first surface can be easily increased. Thus, a stack having a large terrace width and a large step height can be easily obtained.

The thus-obtained stack 11 has good adhesion between the carbon atom thin film 13 and the base portion 12 consisting of SiC. In addition, the carbon atom thin film 13 can be formed over the entire surface of the silicon carbide substrate 51. Thus, the stack 11 is suitable for manufacture of electronic devices that require suitability for mass production, such as transistors.

In the above embodiment, a silicon layer serving as a first member is deposited on the upper wall surface 64A and the side wall surface 64B, facing the susceptor 63, of the cover member 64; however, the embodiment is not limited thereto, and elemental silicon may be disposed as a first member in the first space 63C enclosed by the cover member 64. For example, silicon may be disposed so as to be placed on the bottom wall portion 62B in the first space 63C enclosed by the cover member 64.

Second Embodiment

Figure 13:
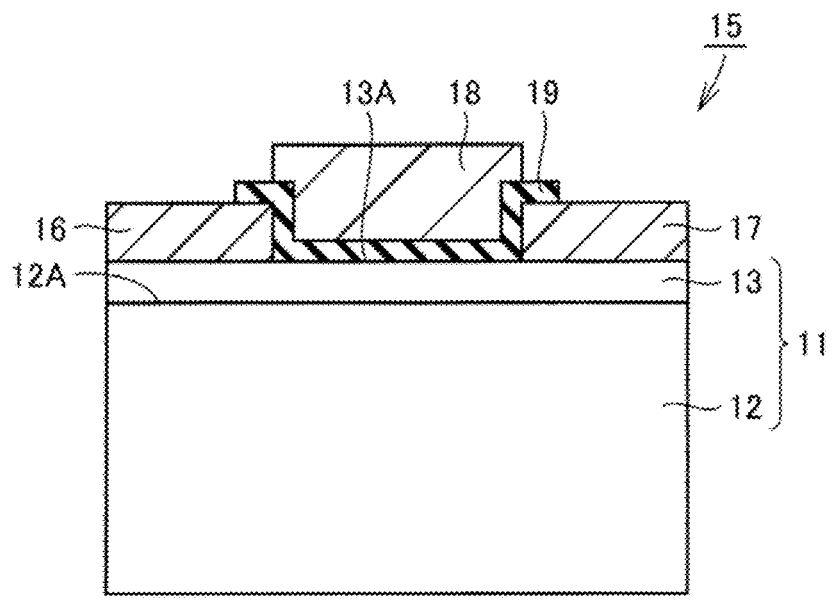
FIG. 13 is a schematic sectional view of a field-effect transistor (FET) according to a second embodiment.

Next, a field-effect transistor (FET) will be described as an example of an electronic device fabricated using the stack 11 according to the first embodiment described above. FIG. 13 is a schematic sectional view of a FET according to a second embodiment. Referring to FIG. 13, a FET 15 according to the second embodiment is fabricated using the stack 11 according to the first embodiment described above. The FET 15 includes the stack 11 including the base portion 12 and the carbon atom thin film 13 stacked in the same manner as in the first embodiment. The carbon atom thin film 13 includes a graphene layer. The FET 15 further includes a source electrode 16, serving as a first electrode, a drain electrode 17 disposed away from the source electrode 16, serving as a second electrode, a gate electrode 18 disposed away from the source electrode 16 and the drain electrode 17, serving as a third electrode, and a gate insulating film 19.

The source electrode 16 is formed in contact with the second main surface 13A. Specifically, for example, the source electrode 16 is formed on the first terrace 26A. The source electrode 16 consists of a conductor capable of ohmic contact with the carbon atom thin film 13, for example, nickel (Ni)/gold (Au). The drain electrode 17 is formed in contact with the second main surface 13A. The drain electrode 17 consists of a conductor capable of ohmic contact with the carbon atom thin film 13, for example, Ni/Au. The drain electrode 17 is also formed on the first terrace 26A.

The gate electrode 18 is formed so as to cover the portion of the second main surface 13A of the carbon atom thin film 13 located between the source electrode 16 and the drain electrode 17. The gate insulating film 19 covers the portion of the second main surface 13A located between the source electrode 16 and the drain electrode 17 and extends to regions covering portions of the upper surfaces of the source electrode 16 and the drain electrode 17 (main surfaces on the opposite side from the side in contact with the carbon atom thin film 13). The gate insulating film 19 consists of, for example, an insulator such as silicon nitride (SiN) or aluminum oxide ($Al_2O_3$).

The gate electrode 18 is disposed in contact with the gate insulating film 19. The gate electrode 18 is disposed in a region corresponding to the portion of the second main surface 13A located between the source electrode 16 and the drain electrode 17. The gate electrode 18 consists of a conductor, for example, Ni/Au.

In this FET 15, when the voltage applied to the gate electrode 18 is lower than a threshold voltage, that is, when the FET 15 is off, an insufficient number of electrons serving as carriers are present in the portion (channel region) of the carbon atom thin film 13 located between the source electrode 16 and the drain electrode 17; therefore, the channel region remains nonconducting when a voltage is applied between the source electrode 16 and the drain electrode 17. On the other hand, when a voltage of not lower than the threshold voltage is applied to the gate electrode 18 so that the FET 15 turns on, electrons serving as carriers are generated in the channel region. As a result, the source electrode 16 and the drain electrode 17 are electrically connected together via the channel region in which electrons serving as carriers have been generated. When a voltage is applied between the source electrode 16 and the drain electrode 17 in this state, a current flows between the source electrode 16 and the drain electrode 17.

Here, in the FET 15 according to the second embodiment, the source electrode 16 and the drain electrode 17 are formed on the second main surface 13A of the stack 11 described above in the first embodiment. The FET 15, including such a stack 11, exhibits improved modulation characteristics. In particular, the modulation characteristics of the FET 15 are further improved because the source electrode 16 and the drain electrode 17 are disposed on the first terrace 26A among the plurality of terraces.

Figure 14:
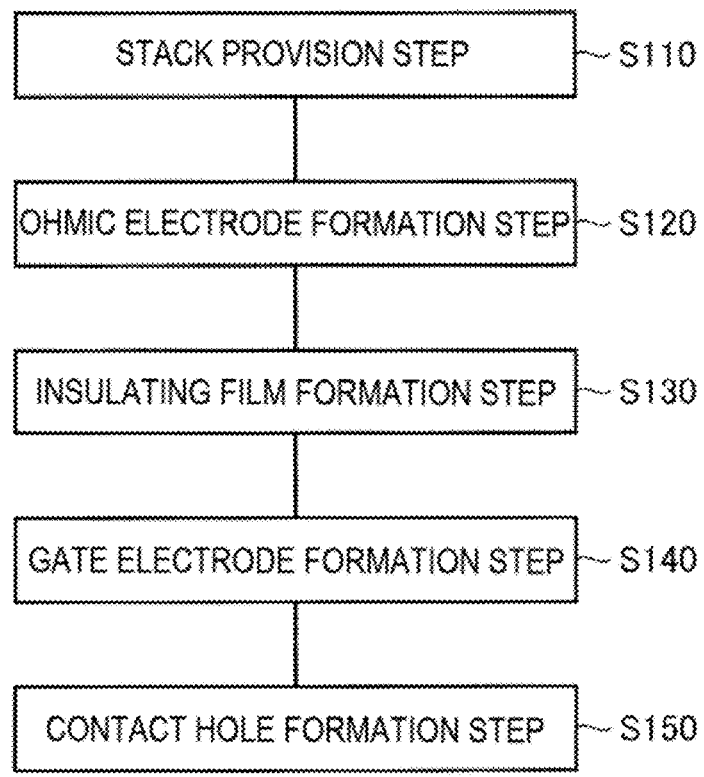
FIG. 14 is a flowchart illustrating typical steps of a method for manufacturing a FET including a carbon atom thin film.

Next, referring to FIGS. 1 and 14, a method for manufacturing the FET 15 according to the second embodiment will be described. FIG. 14 is a flowchart illustrating typical steps of the method for manufacturing the FET 15 including the carbon atom thin film. Referring to FIG. 14, in the method for manufacturing the FET 15 according to the second embodiment, a stack provision step is first performed as step (S110). In this step (S110), the stack 11 according to the first embodiment described above is provided (see FIG. 1). The stack 11 can be manufactured by the method of manufacture described above in the first embodiment.

Figure 15:
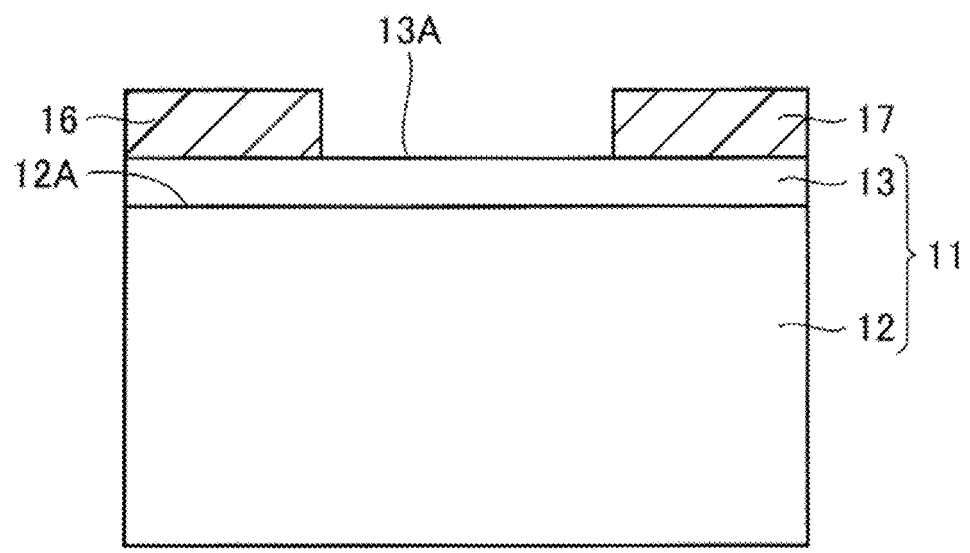
FIG. 15 is a schematic sectional view for description of the method for manufacturing a FET including a carbon atom thin film.

Next, referring to FIG. 14, an ohmic electrode formation step is performed as step (S120). In this step (S120), referring to FIGS. 1 and 15, the source electrode 16 and the drain electrode 17 are formed in contact with the second main surface 13A of the stack 11. For example, the source electrode 16 and the drain electrode 17 can be formed on the second main surface 13A of the carbon atom thin film 13 by forming a mask layer consisting of a resist having openings corresponding to the regions where the source electrode 16 and drain electrode 17 are to be formed, forming a conductive film consisting of the conductor (e.g., Ni/Au) forming the source electrode 16 and the drain electrode 17, and then performing a lift-off process.

Figure 16:
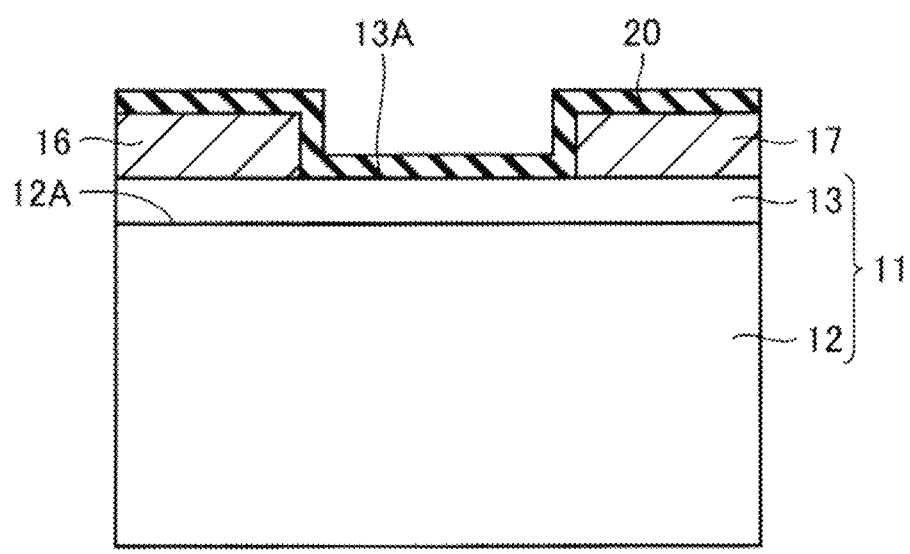
FIG. 16 is a schematic sectional view for description of the method for manufacturing a FET including a carbon atom thin film.

Next, referring to FIG. 14, an insulating film formation step is performed as step (S130). In this step (S130), referring to FIGS. 15 and 16, an insulating film 20 is formed so as to cover the portion of the second main surface 13A of the carbon atom thin film 13 located between the source electrode 16 and the drain electrode 17, the main surface of the source electrode 16 on the opposite side from the stack 11, and the main surface of the drain electrode 17 on the opposite side from stack 11. The insulating film 20 can be formed, for example, by a CVD process. The material used to form the insulating film 20 may be, for example, silicon nitride (SiN).

Figure 17:
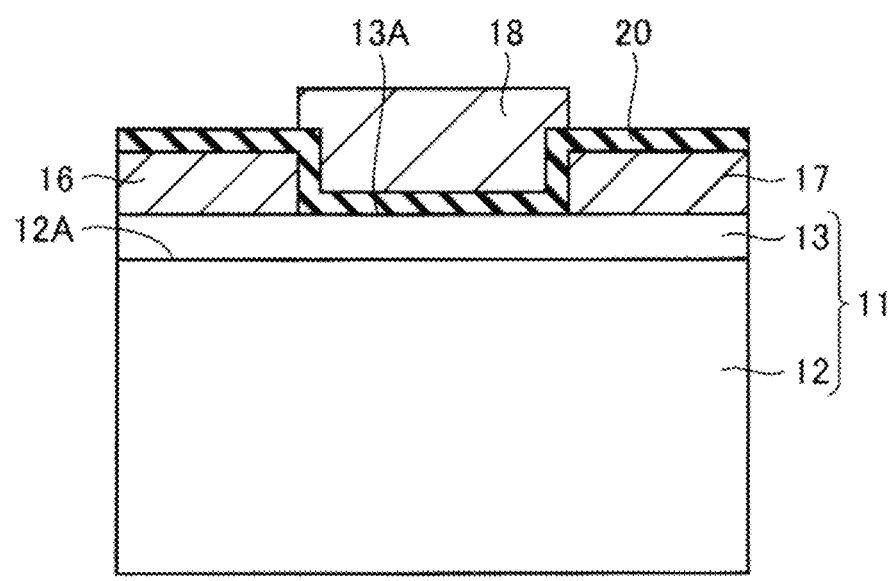
FIG. 17 is a schematic sectional view for description of the method for manufacturing a FET including a carbon atom thin film.

Next, referring to FIG. 14, a gate electrode formation step is performed as step (S140). In this step (S140), referring to FIGS. 16 and 17, the gate electrode 18 is formed in contact with the portion of the insulating film 20 covering the portion of the second main surface 13A located between the source electrode 16 and the drain electrode 17. For example, the gate electrode 18 can be formed by forming a mask layer consisting of a resist having an opening corresponding to the region where the gate electrode 18 is to be formed, forming a conductive film consisting of the conductor (e.g., Ni/Au) forming the gate electrode 18, and then performing a lift-off process.

Next, referring to FIG. 14, a contact hole formation step is performed as step (S150). In this step (S150), referring to FIGS. 17 and 13, contact holes for allowing contact of the source electrode 16 and the drain electrode 17 with wiring are formed by removing portions of the insulating film 20 located on the source electrode 16 and the drain electrode 17. Specifically, for example, a mask having openings in regions corresponding to the source electrode 16 and the drain electrode 17 is formed, and the portions of the insulating film 20 exposed from the openings are removed by etching. Thus, contact holes are formed, and the remaining insulating film 20 becomes the gate insulating film 19. The gate insulating film 19 covers the portion of the second main surface 13A located between the source electrode 16 and the drain electrode 17 and extends to regions covering portions of the upper surfaces of the source electrode 16 and the drain electrode 17 (main surfaces on the opposite side from the side in contact with the carbon atom thin film 13).

By the above steps, the FET 15 according to the second embodiment is finished. Thereafter, for example, wiring is formed, and the individual electronic devices are separated by dicing.

It should be understood that the embodiments disclosed herein are illustrative in all respects and not restrictive in any way. The scope of the present disclosure is defined by the claims, rather than by the foregoing description, and all changes that come within the meaning and range of equivalency of the claims are intended to be embraced therein.

REFERENCE SIGNS LIST 11, 31 stack
12, 32 base portion
12A, 32A first surface
13, 33 carbon atom thin film
13A, 33A second main surface
13B first main surface
15 FET
16 source electrode
17 drain electrode
18 gate electrode
19 gate insulating film
20 insulating film
21A buffer layer
21B, 22A graphene layer
23 silicon atom
24 carbon atom
25 hydrogen atom
26A, 34A first terrace
26B, 34B second terrace
26C, 34C third terrace
27A, 35A first step
27B, 35B second step
28A, 28B, 28C, 28D, 28E, 29A, 29B, 29C, 29D, 29E line
34D fourth terrace
35C third step
51 silicon carbide substrate
51A first substrate surface
61 heating device
62 chamber
62A side wall portion
62B bottom wall portion
62C upper wall portion
63 susceptor
63A substrate holding surface
63C first space
64 cover member
64A upper wall surface
64B side wall surface
65 gas introduction pipe
66 exhaust pipe
67 silicon layer (first member)
L diameter
T, Y, $F_1$, $F_2$ arrow
$H_1$, $H_2$ height
$S_1$, $S_2$ interface
$W_1$, $W_2$ width
S10, S20, S30, S110, S120, S130, S140, S150 step

The invention claimed is:

1. A stack comprising:
a base portion consisting of silicon carbide and having a first surface that is a Si face; and
a carbon atom thin film disposed on the first surface and including a first main surface facing the first surface and a second main surface that is a main surface on an opposite side from the first main surface, the carbon atom thin film consisting of carbon atoms,
wherein the carbon atom thin film includes at least one of a buffer layer that is a carbon atom layer including carbon atoms bonded to silicon atoms forming the Si face and a graphene layer,
the second main surface includes
a plurality of terraces parallel to the Si face of the silicon carbide forming the base portion, and
a plurality of steps connecting together the plurality of terraces,
the terraces have a width of 5 μm or more and 500 μm or less, and
the steps have a height of 10 nm or more and 500 nm or less.

2. The stack according to claim 1, wherein a number of atomic layers of the graphene layer is three or less.

3. An electronic device comprising:
the stack according to claim 1;
a first electrode disposed on the second main surface; and
a second electrode disposed away from the first electrode on the second main surface.

4. A method for manufacturing a stack, comprising the steps of:
providing a silicon carbide substrate having a first substrate surface that is a Si face;
placing the silicon carbide substrate in a first space enclosed by a cover member disposed in a chamber; and
heating the silicon carbide substrate in the first space to remove silicon atoms from a first region including the first substrate surface, thereby converting the first region into at least one of a buffer layer that is a carbon atom layer including carbon atoms bonded to silicon atoms forming the silicon carbide substrate and a graphene layer,
wherein a first member including a material containing silicon atoms is disposed in the first space.

5. The method for manufacturing a stack according to claim 4, wherein the first member is a silicon layer covering at least a portion of an inner wall of the cover member.

6. The stack according to claim 1, wherein the carbon atom thin film includes a buffer layer that is a carbon atom layer including carbon atoms bonded to silicon atoms forming the Si face and a graphene layer.

7. The stack according to claim 6, wherein a number of atomic layers of the graphene layer is three or less.

8. The stack according to claim 1, wherein the terraces have a width of 5 μm or more and 200 μm or less.

9. The stack according to claim 1, wherein the terraces have a width of 5 μm or more and 100 μm or less.

10. The stack according to claim 1, wherein the steps have a height of 10 nm or more and 200 nm or less.

11. The stack according to claim 1, wherein the steps have a height of 10 nm or more and 100 nm or less.

12. The stack according to claim 6, wherein the terraces have a width of 5 μm or more and 200 μm or less.

13. The stack according to claim 6, wherein the terraces have a width of 5 μm or more and 100 μm or less.

14. The stack according to claim 6, wherein the steps have a height of 10 nm or more and 200 nm or less.

15. The stack according to claim 6, wherein the steps have a height of 10 nm or more and 100 nm or less.

16. An electronic device comprising:
the stack according to claim 2;
a first electrode disposed on the second main surface; and
a second electrode disposed away from the first electrode on the second main surface.

17. An electronic device comprising:
the stack according to claim 6;
a first electrode disposed on the second main surface; and
a second electrode disposed away from the first electrode on the second main surface.

18. An electronic device comprising:
the stack according to claim 7;
a first electrode disposed on the second main surface; and
a second electrode disposed away from the first electrode on the second main surface.

19. An electronic device comprising:
the stack according to claim 9;
a first electrode disposed on the second main surface; and
a second electrode disposed away from the first electrode on the second main surface.

20. An electronic device comprising:
the stack according to claim 11;
a first electrode disposed on the second main surface; and
a second electrode disposed away from the first electrode on the second main surface.

* * * * *